(12) United States Patent
Lu et al.

(10) Patent No.: US 11,978,513 B2
(45) Date of Patent: May 7, 2024

(54) GENERATING PATTERNS FOR MEMORY THRESHOLD VOLTAGE DIFFERENCE

(71) Applicant: Micron Technology, Inc., Boise, ID (US)

(72) Inventors: Zhongyuan Lu, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 149 days.

(21) Appl. No.: 17/680,042

(22) Filed: Feb. 24, 2022

(65) Prior Publication Data
US 2023/0268006 A1    Aug. 24, 2023

(51) Int. Cl.
| | | |
|---|---|---|
| G11C 16/10 | (2006.01) | |
| G11C 7/04 | (2006.01) | |
| G11C 16/26 | (2006.01) | |
| G11C 16/34 | (2006.01) | |

(52) U.S. Cl.
CPC .............. *G11C 16/102* (2013.01); *G11C 7/04* (2013.01); *G11C 16/26* (2013.01); *G11C 16/3404* (2013.01)

(58) Field of Classification Search
CPC ......... G11C 16/102; G11C 7/04; G11C 16/26; G11C 16/3404
See application file for complete search history.

(56) References Cited

U.S. PATENT DOCUMENTS

| | | | | |
|---|---|---|---|---|
| 7,593,255 | B2 * | 9/2009 | Happ | .................. G11C 11/5678 |
| | | | | 365/163 |
| 8,861,736 | B2 | 10/2014 | BrightSky et al. | |
| 9,600,237 | B2 * | 3/2017 | Katoh | ..................... G06F 7/588 |
| 9,823,899 | B2 * | 11/2017 | Katoh | .................. G11C 13/004 |

* cited by examiner

*Primary Examiner* — Vanthu T Nguyen
(74) *Attorney, Agent, or Firm* — Brooks, Cameron & Huebsch, PLLC

(57) ABSTRACT

Apparatuses, methods, and systems for generating patterns for memory using threshold voltage difference are disclosed. An embodiment includes circuitry and a memory array including a plurality of memory cells. The circuitry can select a group of memory cells from the plurality of memory cells, program each memory cell of the group to a first data state, determine a first threshold voltage of each memory cell of the group, program each memory cell of the group to a second data state, perform a number of snapback events on each memory cell of the group, program each memory cell of the group to the first data state, determine a second threshold voltage of each memory cell of the group having the first data state, and generate a pattern for the memory array based, at least in part, on a difference between the first threshold voltage and the second threshold voltage.

18 Claims, 6 Drawing Sheets

GENERATING PATTERNS FOR MEMORY THRESHOLD VOLTAGE DIFFERENCE

TECHNICAL FIELD

The present disclosure relates generally to semiconductor memory and methods, and more particularly, to generating patterns for memory using threshold voltage difference.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
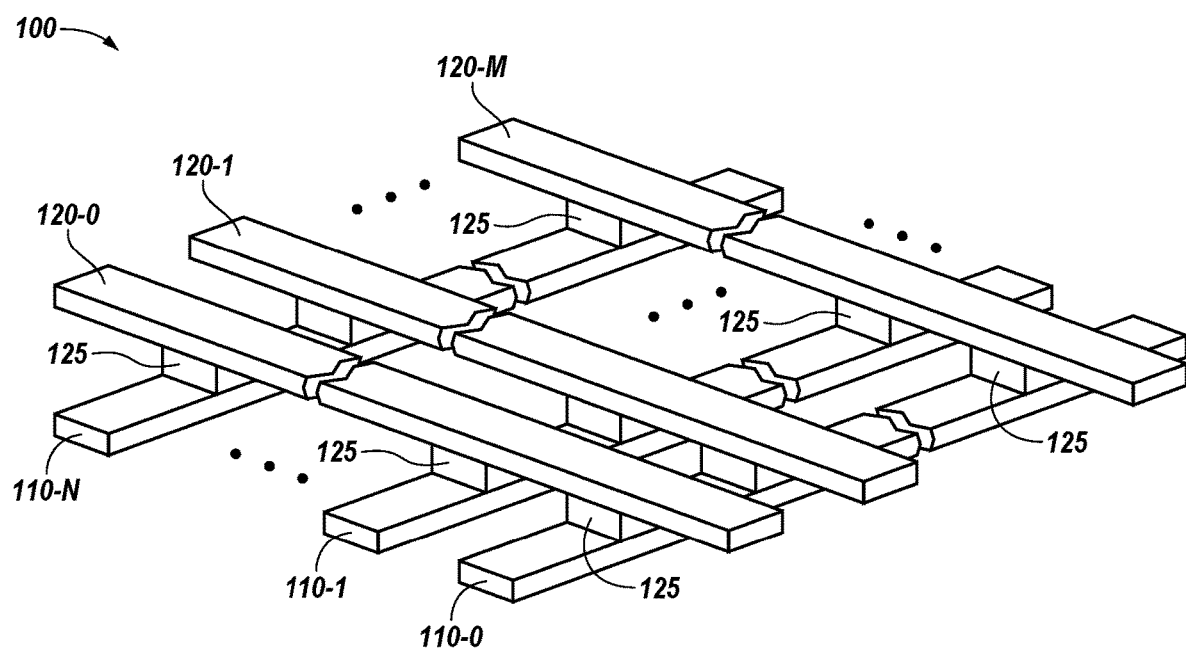
FIG. 1 is a three-dimensional view of an example of a memory array, in accordance with an embodiment of the present disclosure.

The present disclosure includes apparatuses, methods, and systems for generating patterns for memory using threshold voltage difference. An example apparatus includes a memory array including a plurality of memory cells and circuitry coupled to the memory array, wherein the circuitry is configured to select a group of memory cells from the plurality of memory cells, program each memory cell of the group to a first data state, determine a first threshold voltage of each memory cell of the group, program each memory cell of the group to a second data state, perform a number of snapback events on each memory cell of the group, program each memory cell of the group to the first data state, determine a second threshold voltage of each memory cell of the group having the first data state, and generate a pattern for the memory array based, at least in part, on a difference between the first threshold voltage and the second threshold voltage.

Some memory applications may have various requirements for securely storing data in the memory and/or authenticating data stored in the memory. Previous memory apparatuses have utilized physical unclonable functions (PUFs) for storing secret codes used for authentication and key generation in order to meet such data security requirements. However, utilizing these PUFs can result in inconsistences due to temperature variation of the memory device utilizing the PUF and/or usage wear of the memory device (e.g., attributable to performed read and write operations), which can make them not repeatable throughout the lifetime of the memory. Further, specific portions (e.g., bits) of the memory may need to be dedicated for only PUF operations, which can reduce the storage capacity and/or density of the memory.

Embodiments of the present disclosure, however, may utilize a threshold voltage difference to generate a pattern that may be used for authenticating data stored in a memory device and/or encrypting data stored in the memory device. Embodiments of the present disclosure provide that the generated pattern is unique to the memory device (e.g., due to material variations and/or processing variations associated with memory device fabrication). Additionally, utilizing the threshold voltage difference to generate the pattern can provide that temperature variations of the device and/or usage wear of the device are negligible parameters (e.g., the threshold voltage difference to generate a pattern is independent of temperature of the device and/or independent of usage wear of the device). Accordingly, such patterns can be repeatable throughout the lifetime of the memory device. Further, specific portions of the memory may not need to be dedicated to generating such patterns. For instance, such patterns can be generating using the standard memory cells of the main storage array of the memory. Accordingly, utilizing the threshold voltage to generate the pattern can increase the storage capacity and/or density of the memory (e.g., as compared with previous data security approaches that utilize PUFs).

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states (e.g., a set state or a reset state). In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials (e.g., chalcogenide storage materials) may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional vertical pillar memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
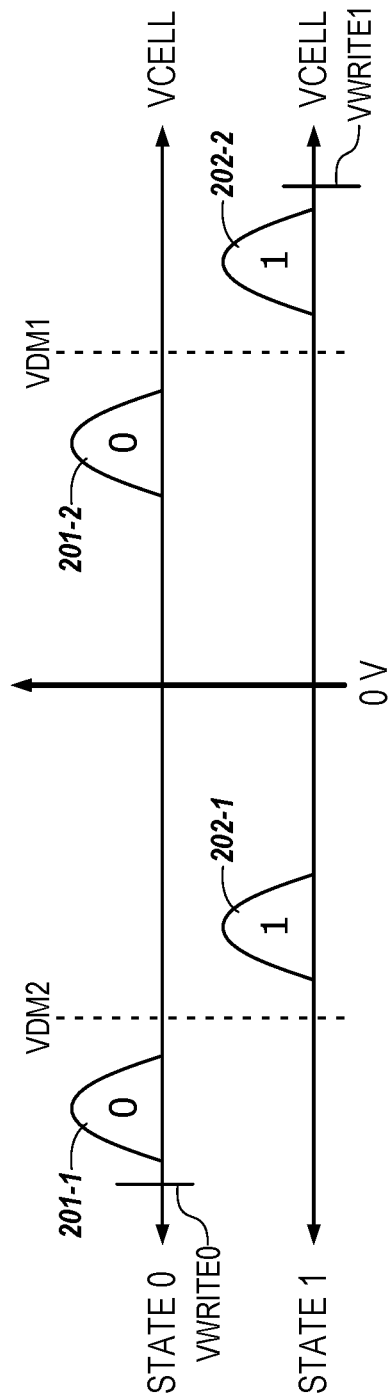
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
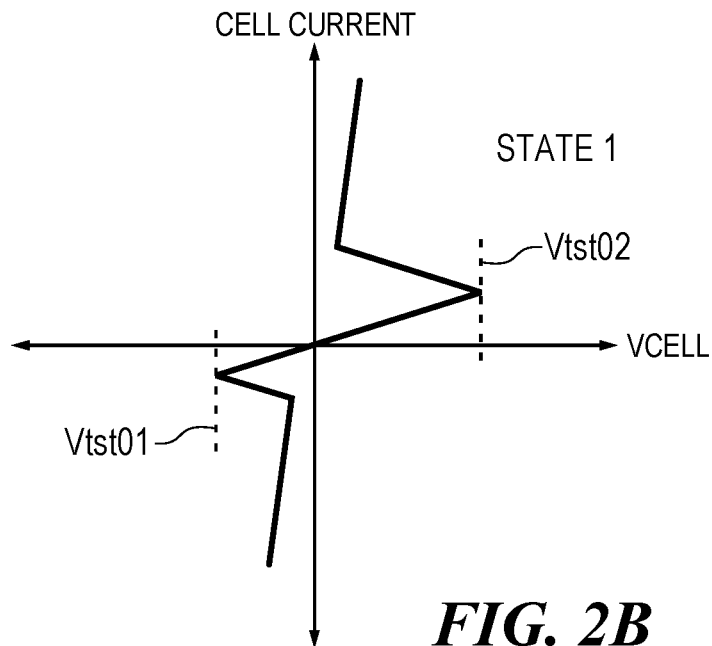
FIG. 2B is an example of a current-versus-voltage curve corresponding to a memory state of FIG. 2A, in accordance with an embodiment of the present disclosure.
Figure 2C:
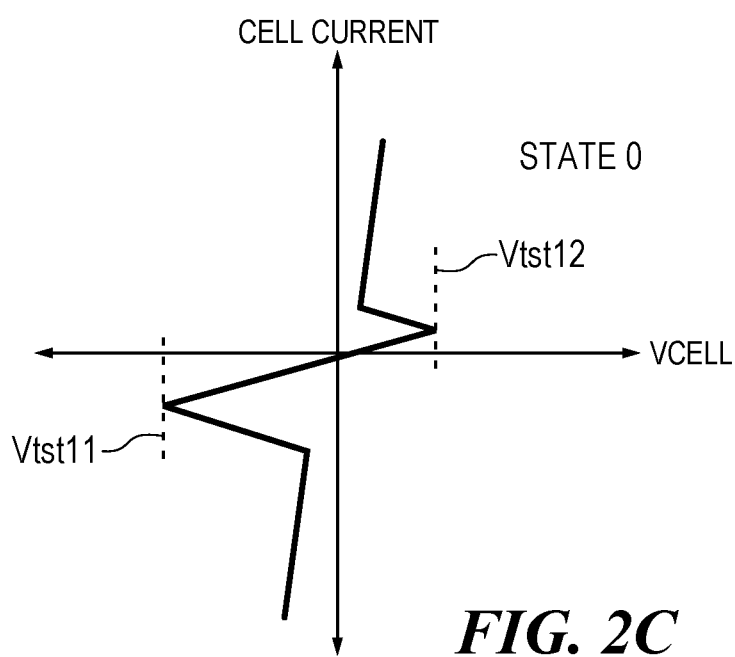
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

Figure 3:
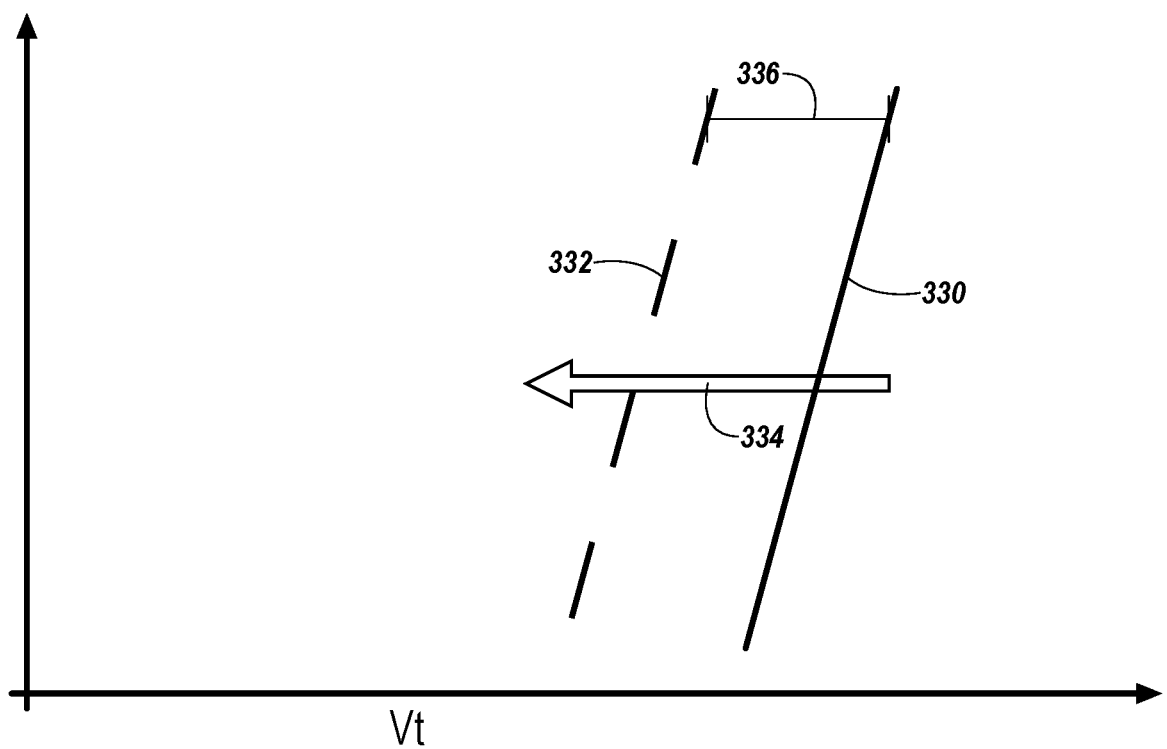
FIG. 3 illustrates a plot of threshold voltage difference that can be used to generate patterns for memory, in accordance with an embodiment of the present disclosure.

FIG. 3 illustrates a plot of threshold voltage difference that can be used to generate patterns for memory, in accordance with an embodiment of the present disclosure. As shown in FIG. 3, a number of memory cells (e.g., memory cells 125 previously described in connection with FIG. 1) each programmed to a first data state (e.g., a reset state) can have threshold voltages corresponding to threshold voltage distribution 330.

After the threshold voltages of each of the number of memory cells each programmed to the first data state have been determined, each of the number of number of memory cells can be programmed to a second data state (e.g., a set state). After each of the number of memory cells is programmed to the second data state, a number of snapback events can be performed on each of the number of number of memory cells. As an example, the number of snapback events can be in a range from 10 to 100, inclusive. However, other numbers of snapback events can be performed on the number of memory cells programmed to the second data state. One or more embodiments provide that the number of snapback events can be at least 10, such as in an inclusive range from 10 to 25, 20 to 35, 35 to 50, 50 to 75, or 75 to 100.

After the number of snapback events is performed on each of the number of memory cells programmed to the second data state, each of the number of memory cells can be programmed (e.g., re-programmed) to the first data state (e.g., the reset state) and the threshold voltages can again be determined. These threshold voltages can correspond to threshold voltage distribution 332. As shown in FIG. 3, after performing the number of snapback events on each of the number of memory cells programmed to the second data state, then programming each of the number of memory cells to the first data state (e.g., the reset state), the threshold voltages of the memory cells are different than prior to performing the number of snapback events (e.g., the threshold voltages of the cells after they have been re-programmed to the first data state are different than when they were initially programmed to the first data state). For example, as shown in FIG. 3, the threshold voltage distribution for the memory cells has shifted (e.g., the threshold voltages of the cells have decreased) in the direction of arrow 334. For instance, the magnitude of the threshold voltage of the cells after they have been re-programmed to the first data state is less than the magnitude of the threshold voltage of the cells when they were initially programmed to the first data state. In FIG. 3, this threshold voltage difference is illustrated as the difference 336 between distribution 330 and distribution 332. The threshold voltage difference can have various values for differing applications.

This threshold voltage difference 336 may be utilized to generate a pattern that may be used for authenticating data stored in a memory device and/or encrypting data stored in the memory device. Because the threshold voltage difference can be unique to each particular memory device, the pattern that is generated based, at least in part, on the threshold voltage difference, can also be unique to each particular memory device. The uniqueness of the threshold voltage difference 336, and the pattern that is generated based on the threshold voltage difference, can be due to material variations and/or processing variations associated with the fabrication of the memory device, for example.

One or more embodiments provide that a magnitude of a voltage utilized to program each memory cell to the first data state is less than a magnitude of a power-on-reset voltage (e.g., a power-on-reset voltage for the memory array). Utilizing this relatively lower magnitude voltage may provide that applying the relatively lower magnitude voltage does not have an effect on power-on-reset operations of the memory device. Also, utilizing this relatively lower magnitude voltage may provide for an enhanced (e.g., more readily measurable and/or observable) threshold voltage difference. One or more embodiments provide that a relatively lower number of snapback events may be performed on each of the number of memory cells programmed to the second data state when a relatively lower magnitude voltage is utilized to program each memory cell of the group to the first data state, as compared to a relatively higher number of snapback events performed on each of the number of memory cells programmed to the second data state when a relatively higher magnitude voltage is utilized to program each memory cell of the group to the first data state.

Figure 4:
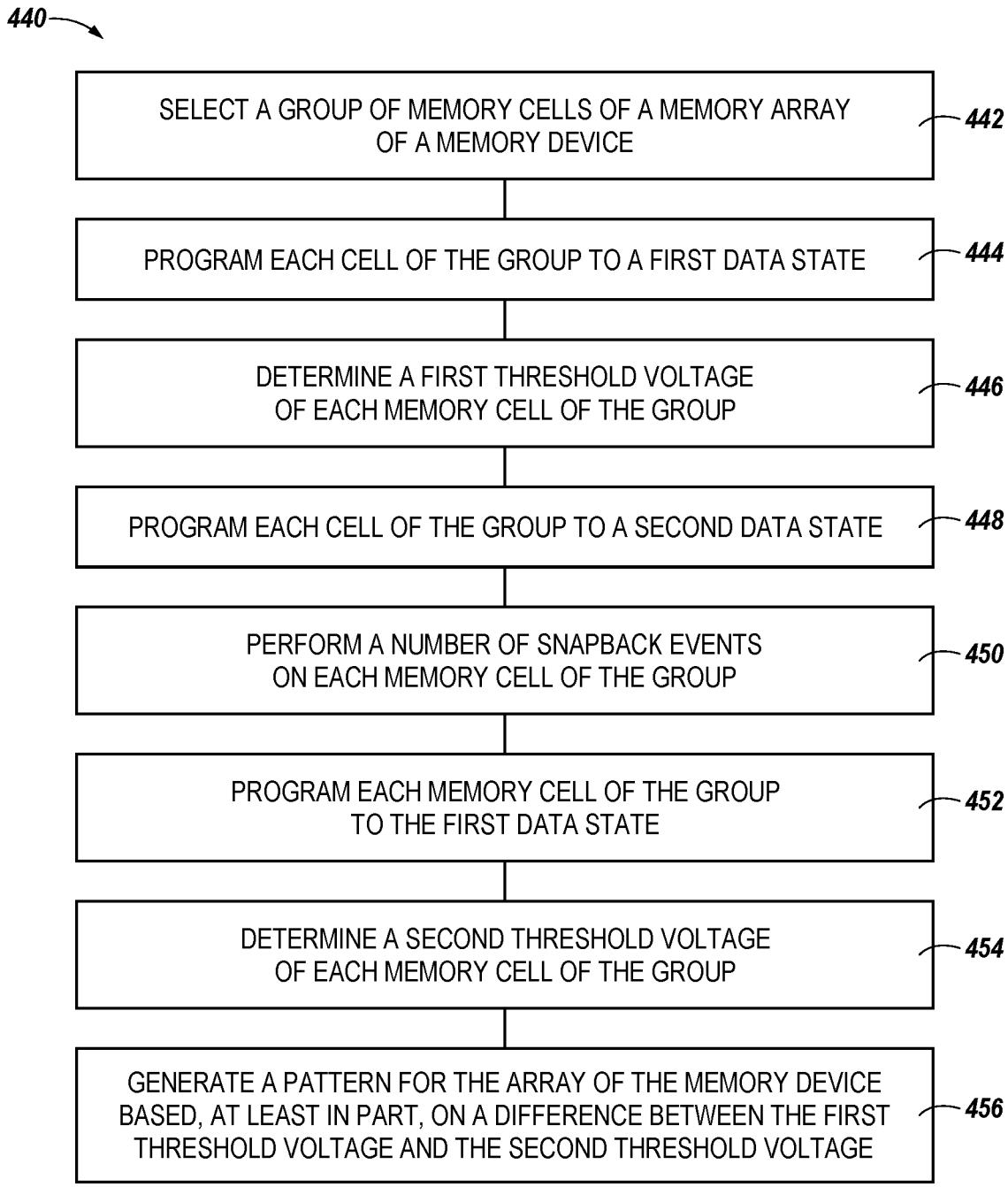
FIG. 4 illustrates a flow diagram corresponding to a method for generating patterns for memory using threshold voltage difference, in accordance with an embodiment of the present disclosure.

FIG. 4 illustrates a flow diagram corresponding to a method 440 for generating patterns for memory using threshold voltage difference, in accordance with an embodiment of the present disclosure. The method 440 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. For example, method 440 can be performed by controller 504 further described in connection with FIG. 5.

At operation 442, a group of memory cells of a memory array (e.g., memory cells 125 of array 100 previously described in connection with FIG. 1) of a memory device can be selected. The group of memory cells can include different numbers of memory cells for various applications. For instance, the group of memory cells can include 12 or more memory cells, 25 or more memory cells, 50 or more memory cells, or 100 or more memory cells. In some embodiments, the group of memory cells can be a dedicated array or dedicated portion of an array (e.g., a sub-array). In some embodiments, the group of memory cells may be part of a main storage array of the memory device.

One or more embodiments provide that the memory cells of the group can be selected to maximize a distance between the selected memory cells (e.g., the memory cells can be selected from different physical areas or zones of the memory device). Selecting the memory cells of the group to maximize a distance between the selected memory cells may enhance (e.g., increase) the threshold voltage difference that may be utilized to generate the pattern, which may be used for authenticating the data stored in the memory device and/or encrypting the data stored in the memory device.

At operation 444, each memory cell of the group can be programmed to a first data state (e.g., a reset state). As previously described herein, the memory cells can include a material (e.g., a chalcogenide storage material) programmable to different data states.

At operation 446 (e.g., after each memory cell of the group has been programmed to the first data state), a first threshold voltage of each memory cell of the group can be determined. For instance, the first threshold voltage for each memory cell of the group may be measured.

At operation 448, each memory cell of the group can be programmed to a second data state (e.g., a set state). For instance, each memory cell of the group can be programmed from the first data state (e.g., the reset state) to the second data state (e.g., the set state).

At operation 450 (e.g., after each memory cell of the group has been programmed to the second data state), a number of snapback events can be performed on each memory cell of the group. Differing numbers of snapback events may be performed for various applications. For example, as previously described herein, one or more embodiments provide that the number of snapback events is in a range from 10 to 100, inclusive. However, other numbers of snapback events may be utilized.

At operation 452 (after of the number of snapback events have been performed), each memory cell of the group can be programmed (e.g., re-programmed) to the first data state. For instance, each memory cell of the group can be programmed from the second data state (e.g., the set state) to the first data state (e.g., the reset state) after performing the number of snapback events.

At operation 454 (e.g., after re-programming each memory cell of the group to the first data state), a second threshold voltage of each memory cell of the group can be determined. Embodiments provide that the second threshold voltage can be determined after performing the number of snapback events on each memory cell of the group programmed to the set state and after programming each memory cell of the group to the reset state from the set state.

At operation 456, a pattern for the array of the memory device based, at least in part, on a difference between the first threshold voltage and the second threshold voltage can be generated. As previously described herein, the first threshold voltage and the second threshold voltage can be different from one another. Additionally, the difference between the first threshold voltage and the second threshold voltage can be unique to the memory cells selected (at operation 442) for the group of memory cells (e.g., unique to the memory device). As the difference between the first threshold voltage and the second threshold voltage can be unique, the generated pattern can also be unique to the memory device. Further, the difference between the first threshold voltage and the second threshold voltage can be independent of the temperature at which the first and second threshold voltages are determined.

Although not shown in FIG. 4, the method 440 can include one or more operations to authenticate the data stored in the memory device using the generated pattern. Because the generated pattern is unique (e.g., unique to the memory device as compared to other memory devices also having chalcogenide storage materials, as well as different types of memory devices), the authentication of the data stored in the memory device may utilize the generated pattern. As an example, the pattern may be accessed and/or verified as part of operations to authenticate the data stored in the memory device.

Although not shown in FIG. 4, the method 440 can include one or more operations to encrypt data stored in the memory device using the generated pattern. As previously described, because the generated pattern is unique encryption of the data stored in the memory device may utilize the generated pattern. As an example, the pattern may be accessed and/or verified as part of operations to encrypt and/or decrypt the data stored in the memory device.

Although not shown in FIG. 4, the method 440 can include one or more operations to erase the difference between the first threshold voltage and the second threshold voltage. For example, applying a plurality of reset pulses to each memory cell of the group (e.g., to program each memory cell of the group to the reset data state after performing the number of snapback events) can erase the difference between the first threshold voltage and the second threshold voltage. Erasing the difference between the first threshold voltage and the second threshold voltage can provide that the difference is not available for discovery (e.g., discovery by an unauthorized party). For instance, each memory cell of the group can have the first threshold voltage (e.g., return to the first threshold voltage from the second threshold voltage) upon the plurality of reset pulses being applied thereto. Embodiments provide that applying the plurality of reset pulses to each memory cell of the group does not have an effect on power-on-reset operations of the memory device.

Figure 5:
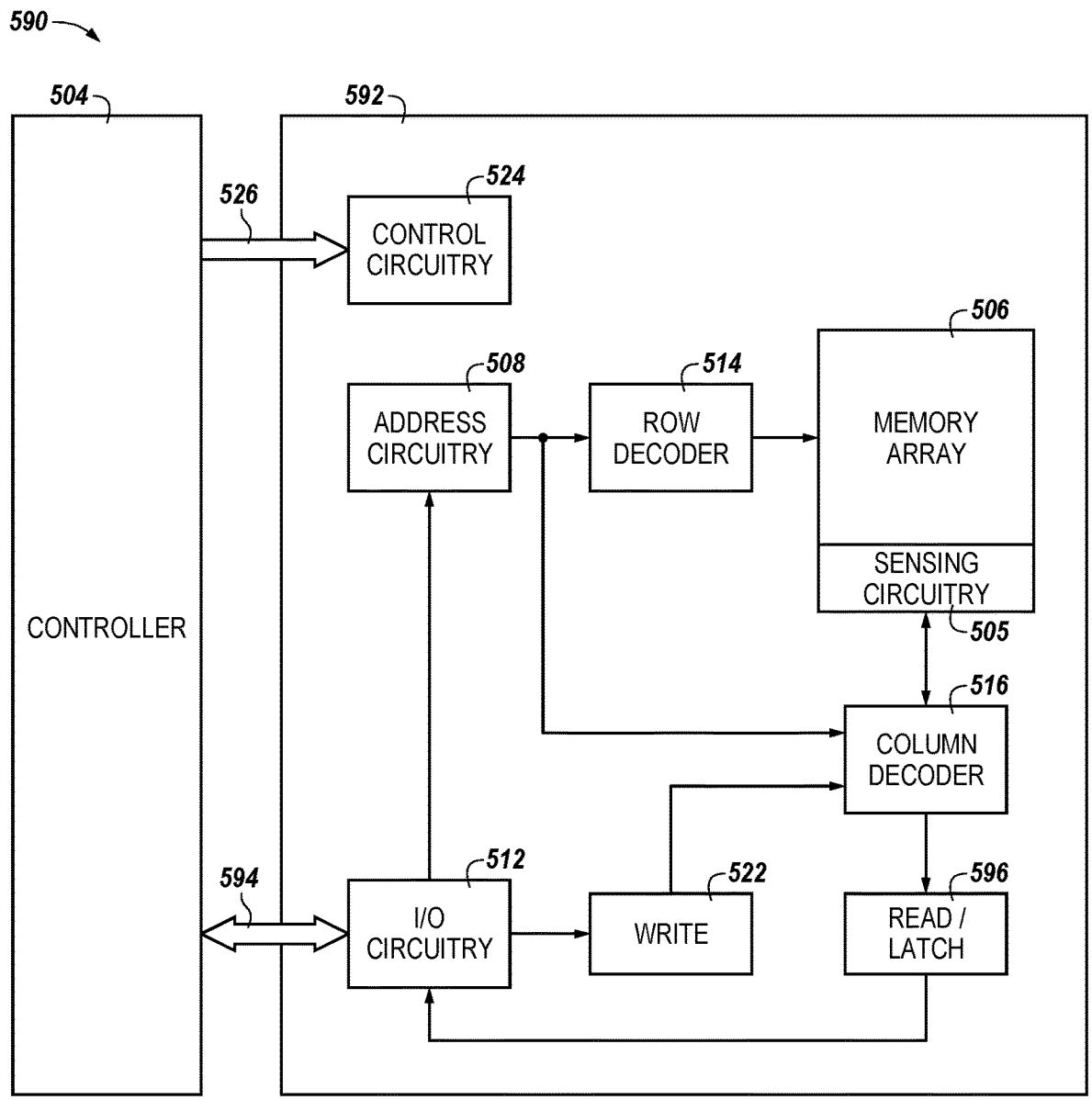
FIG. 5 is a block diagram illustration of an example apparatus, in accordance with an embodiment of the present disclosure.

FIG. 5 is a block diagram illustration of an example apparatus, such as an electronic memory system 590, in accordance with an embodiment of the present disclosure. Memory system 590 may include an apparatus, such as a memory device 592 and a controller 504, such as a memory controller (e.g., a host controller). Controller 504 might include a processor, for example. Controller 504 might be coupled to a host, for example, and may receive command signals (or commands), address signals (or addresses), and data signals (or data) from the host and may output data to the host. Controller 504 can perform one or more operations for generating patterns for memory device 592, in accordance with the present disclosure.

Memory device 592 includes a memory array 506 of memory cells. For example, memory array 506 may include one or more of the memory arrays, such as a cross-point array, of memory cells disclosed herein. Memory device 592 may include address circuitry 508 to latch address signals provided over I/O connections 594 through I/O circuitry 512. Address signals may be received and decoded by a row decoder 514 and a column decoder 516 to access the memory array 506.

Memory device 592 may sense (e.g., read) data in memory array 506 by sensing voltage and/or current changes in the memory array columns using sense/buffer circuitry that in some examples may be read/latch circuitry 596. Read/latch circuitry 596 may read and latch data from the memory array 506. Sensing circuitry 505 may include a number of sense amplifiers coupled to memory cells of memory array 506, which may operate in combination with the read/latch circuitry 596 to sense (e.g., read) memory states from targeted memory cells. I/O circuitry 512 may be included for bi-directional data communication over the I/O connections 594 with controller 504. Write circuitry 522 may be included to write data to memory array 506.

Control circuitry 524 may decode signals provided by control connections 526 from controller 504. These signals may include chip signals, write enable signals, and address latch signals that are used to control the operations on memory array 506, including data read and data write operations.

Control circuitry 524 may be included in controller 504, for example. Controller 504 may include other circuitry, firmware, software, or the like, whether alone or in combination. Controller 504 may be an external controller (e.g., in a separate die from the memory array 506, whether wholly or in part) or an internal controller (e.g., included in a same die as the memory array 506). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array including a plurality of memory cells; and
   circuitry coupled to the memory array, wherein the circuitry is configured to:
   select a group of memory cells from the plurality of memory cells;
   apply a first voltage pulse to each memory cell of the group to program each memory cell of the group to a first data state;
   determine a first threshold voltage of each memory cell of the group having the first data state;
   apply a second voltage pulse to each memory cell of the group to program each memory cell of the group from the first data state to a second data state, wherein:
   a number of snapback events occur on each memory cell of the group after each memory cell of the group is programmed to the second data state; and
   each memory cell of the group is programmed from the second data state back to the first data state after the number of snapback events occur on each memory cell of the group;
   determine a second threshold voltage of each memory cell of the group after each memory cell of the group is programmed from the second data state back to the first data state; and
   generate a pattern for the memory array based, at least in part, on a difference between the first threshold voltage and the second threshold voltage, wherein the pattern is used to encrypt data stored in the memory array and authenticate the data stored in the memory array.

2. The apparatus of claim 1, wherein each memory cell of the group comprises a chalcogenide storage material.

3. The apparatus of claim 1, wherein the first data state is a reset state and the second data state is a set state.

4. The apparatus of claim 1, wherein the number of snapback events is in a range from 10 to 100, inclusive.

5. The apparatus of claim 1, wherein a magnitude of a voltage utilized to program each memory cell of the group to the first data state is less than a magnitude of a power-on-reset voltage for the memory array.

6. The apparatus of claim 1, wherein the circuitry is configured to apply a plurality of reset pulses to each memory cell of the group to program each memory cell of the group to the first data state after performing the number of snapback events.

7. The apparatus of claim 6, wherein each memory cell of the group has the first threshold voltage upon the plurality of reset pulses being applied thereto.

8. A method of operating memory, the method comprising:
   selecting a group of memory cells of a memory device;
   applying a first voltage pulse to each memory cell of the group to program each memory cell of the group to a reset state;
   determining a first threshold voltage for each memory cell of the group after programming each memory cell of the group to the reset state;
   applying a second voltage pulse to each memory cell of the group to program each memory cell of the group from the reset state to a set state, wherein:
   a number of snapback events are performed on each memory cell of the group after each memory cell of the group is programmed to the set state; and
   each memory cell of the group is programmed from the set state back to the reset state after the number of snapback events are performed on each memory cell of the group;
   determining a second threshold voltage for each memory cell of the group after each memory cell of the group is programmed from the set state back to the reset state; and
   generating a pattern for the memory device based, at least in part, on a difference between the first threshold voltage and the second threshold voltage, wherein the pattern is used to encrypt data stored in the memory device and authenticate the data stored in the memory device.

9. The method of claim 8, wherein the pattern is unique to the memory device.

10. The method of claim 8, wherein a magnitude of the second threshold voltage is less than a magnitude of the first threshold voltage.

11. The method of claim 8, wherein the method includes applying a plurality of reset pulses to each memory cell of the group to program each memory cell of the group to the reset data state after performing the number of snapback events.

12. An apparatus, comprising:
   a memory array including a plurality of memory cells; and
   circuitry coupled to the array of memory cells, wherein the circuitry is configured to:
   select a group of memory cells from the plurality of memory cells;
   apply a first voltage pulse to each memory cell of the group of memory cells to program each memory cell of the group to a reset state;
   determine a first threshold voltage of each memory cell of the group having the reset state;
   apply a second voltage pulse to each memory cell of the group to program each memory cell of the group to a set state, wherein:
   a number of snapback events occur on each memory cell of the group after each memory cell of the group is programmed to the set state; and
   each memory cell of the group is programmed from the set state back to the reset state after the number of snapback events occur on each memory cell of the group;
   determine a second threshold voltage of each memory cell of the group after each memory cell of the group is programmed from the set state back to the reset state; and
   generate a pattern for encrypting data stored in the memory array and authenticating the data stored in the memory array based, at least in part, on a difference between the first threshold voltage and the second threshold voltage.

13. The apparatus of claim 12, wherein the difference between the first threshold voltage and the second threshold voltage is independent of a temperature at which the first threshold voltage and the second threshold voltage are determined.

14. The apparatus of claim 12, wherein the number of snapback events is at least claim 10.

15. The apparatus of claim 12, wherein the circuitry is configured to erase the difference between the first threshold voltage and the second threshold voltage by applying a plurality of reset pulses to each memory cell of the group.

16. The apparatus of claim 12, wherein a magnitude of the first threshold voltage is greater than a magnitude of the second threshold voltage.

17. The apparatus of claim 12, wherein the memory array is a cross-point array.

18. The apparatus of claim 12, wherein the memory array is a vertical pillar array.

\* \* \* \* \*